(12) United States Patent
Liu et al.

(10) Patent No.: US 10,585,539 B2
(45) Date of Patent: Mar. 10, 2020

(54) HIGH SENSITIVITY READOUT CIRCUIT FOR TOUCH PANEL

(71) Applicant: Novatek Microelectronics Corp., Hsinchu (TW)

(72) Inventors: I-Te Liu, Hsinchu County (TW); Wei-Zen Chen, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/022,710

(22) Filed: Jun. 29, 2018

(65) Prior Publication Data

US 2019/0129533 A1 May 2, 2019

Related U.S. Application Data (60) Provisional application No. 62/577,175, filed on Oct. 26, 2017.

(51) Int. Cl.
| | |
|---|---|
| *G06F 3/041* | (2006.01) |
| *G06F 3/044* | (2006.01) |
| *H03K 17/96* | (2006.01) |
| *H04N 5/378* | (2011.01) |

(52) U.S. Cl.
CPC .......... *G06F 3/044* (2013.01); *G06F 3/04166* (2019.05); *G06F 3/04182* (2019.05); *G06F 3/041* (2013.01); *G06F 3/0416* (2013.01); *G06F 3/0418* (2013.01); *H03K 17/962* (2013.01); *H04N 5/378* (2013.01)

(58) Field of Classification Search
CPC .... G06F 3/041; G06F 3/0416; G06F 3/04166; G06F 3/0418; G06F 3/04182; G06F 3/044; H03K 17/962; H03K 2217/960725; H04N 5/378

See application file for complete search history.

(56) References Cited

U.S. PATENT DOCUMENTS

| | | | | |
|---|---|---|---|---|
| 5,374,787 A | * | 12/1994 | Miller | G06F 1/1626 178/18.06 |
| 5,488,204 A | * | 1/1996 | Mead | G06F 3/041 178/18.06 |
| 5,543,588 A | * | 8/1996 | Bisset | G06F 1/1626 178/18.06 |

(Continued)

OTHER PUBLICATIONS

Hyoung-Rae Kim et al.,"A Mobile-Display-Driver IC Embedding a Capacitive-Touch-Screen Controller System", 2010 IEEE International Solid-State Circuits Conference—(ISSCC), Feb. 8, 2010,pp. 114-115.

(Continued)

*Primary Examiner* — Michael J Eurice
(74) *Attorney, Agent, or Firm* — JCIPRNET (57) ABSTRACT

A readout circuit of a touch panel is provided. The readout circuit includes a charge modulator and a correlated double sampling demodulator. The charge modulator is configured to provide a driving current to charge or discharge a sensing electrode of the touch panel and generate a sensing voltage signal. The correlated double sampling demodulator is coupled to the charge modulator. The correlated double sampling demodulator is configured to sample the sensing voltage signal to obtain a voltage variation when a touch event happens. A method for driving the touch panel is also provided.

18 Claims, 7 Drawing Sheets

(56) References Cited

U.S. PATENT DOCUMENTS

| | | | | |
|---|---|---|---|---|
| 5,543,591 | A * | 8/1996 | Gillespie | G06F 3/038 178/18.03 |
| 5,861,583 | A * | 1/1999 | Schediwy | G06F 3/041 178/18.01 |
| 5,880,411 | A * | 3/1999 | Gillespie | G06F 3/03547 178/18.01 |
| 6,028,271 | A * | 2/2000 | Gillespie | G06F 3/03547 178/18.01 |
| 8,294,687 | B1 * | 10/2012 | Ksondzyk | G06F 3/0418 178/18.01 |
| 8,836,669 | B1 * | 9/2014 | Ogirko | G06F 3/044 178/18.06 |
| 9,209,802 | B1 * | 12/2015 | Maharyta | H03K 17/955 |
| 9,383,395 | B1 * | 7/2016 | Ogirko | G01R 27/2605 |
| 9,817,537 | B1 * | 11/2017 | Shakya | G06F 3/044 |
| 9,921,668 | B1 * | 3/2018 | Chadda | G06F 3/041 |
| 2005/0068044 | A1 * | 3/2005 | Peine | A61B 5/037 324/658 |
| 2005/0122119 | A1 * | 6/2005 | Barlow | G01D 5/24 324/662 |
| 2006/0187214 | A1 * | 8/2006 | Gillespie | G06F 3/03547 345/173 |
| 2007/0075710 | A1 * | 4/2007 | Hargreaves | G01R 27/2605 324/658 |
| 2008/0036473 | A1 * | 2/2008 | Jansson | G06F 3/03547 324/678 |
| 2008/0048997 | A1 * | 2/2008 | Gillespie | G06F 3/03547 345/174 |
| 2008/0069413 | A1 * | 3/2008 | Riedijk | G06K 9/0002 382/124 |
| 2008/0111714 | A1 * | 5/2008 | Kremin | G06F 3/044 341/33 |
| 2008/0234895 | A1 * | 9/2008 | Veerasamy | B32B 17/10036 701/36 |
| 2010/0139991 | A1 * | 6/2010 | Philipp | G06F 3/0418 178/18.06 |
| 2010/0181180 | A1 * | 7/2010 | Peter | H03K 17/955 200/5 R |
| 2010/0328262 | A1 * | 12/2010 | Huang | G06F 3/0416 345/174 |
| 2011/0001492 | A1 * | 1/2011 | Nys | H03M 1/123 324/658 |
| 2011/0261005 | A1 * | 10/2011 | Joharapurkar | G06F 3/0418 345/174 |
| 2012/0113049 | A1 * | 5/2012 | Paulsen | G06F 3/044 345/174 |
| 2012/0176179 | A1 * | 7/2012 | Harders | H03K 17/962 327/517 |
| 2013/0120309 | A1 * | 5/2013 | Mo | G06F 3/044 345/174 |
| 2014/0077823 | A1 * | 3/2014 | Angelini | G06F 3/044 324/658 |
| 2014/0085985 | A1 * | 3/2014 | Pan | G11C 5/145 365/185.18 |
| 2014/0091815 | A1 * | 4/2014 | Suwald | G01R 27/2605 324/658 |
| 2014/0152610 | A1 * | 6/2014 | Suwald | G01D 5/24 345/174 |
| 2014/0267129 | A1 * | 9/2014 | Rebeschi | G06F 3/0418 345/174 |
| 2014/0292375 | A1 * | 10/2014 | Angelini | G06G 7/00 327/94 |
| 2015/0145801 | A1 * | 5/2015 | Angelini | G06F 3/044 345/174 |
| 2015/0212623 | A1 * | 7/2015 | Hatano | G06F 3/044 345/174 |
| 2015/0212644 | A1 * | 7/2015 | Noto | G06F 3/0416 345/174 |
| 2015/0309618 | A1 * | 10/2015 | Keppel, Jr. | G06F 3/044 345/174 |
| 2016/0018867 | A1 * | 1/2016 | Nys | G01R 27/2605 324/674 |
| 2016/0124544 | A1 * | 5/2016 | Kang | G06F 3/044 345/174 |
| 2016/0232394 | A1 * | 8/2016 | Riedijk | G06F 3/044 |
| 2017/0060297 | A1 * | 3/2017 | Gradinariu | G06F 3/044 |
| 2017/0212635 | A1 * | 7/2017 | Cordeiro | G06F 3/0416 |
| 2017/0228096 | A1 * | 8/2017 | Nathan | G06F 3/0416 |
| 2017/0330013 | A1 * | 11/2017 | Ramberg | G06K 9/0002 |
| 2018/0203544 | A1 * | 7/2018 | Suwald | G06F 3/0416 |
| 2018/0356936 | A1 * | 12/2018 | Shepelev | G06F 3/044 |
| 2019/0079634 | A1 * | 3/2019 | Kravets | G06F 3/0418 |

OTHER PUBLICATIONS

Jun-Hyeok Yang et al.,"A Highly Noise-Immune Touch Controller Using Filtered-Delta-Integration and a Charge-Interpolation Technique for 10.1-inch Capacitive Touch-Screen Panels", 2013 IEEE International Solid-State Circuits Conference,Feb. 20, 2013, pp. 390-391.

Hyungcheol Shin et al.,"A 55dB SNR with 240Hz Frame Scan Rate Mutual Capacitor 30×24 Touch-Screen Panel Read-Out IC Using Code-Division Multiple Sensing Technique", 2013 IEEE International Solid-State Circuits Conference,Feb. 20, 2013, pp. 388-389.

Noriyuki Miura et al.,"A 1mm-Pitch 80×80-Channel 322Hz-Frame-Rate Touch Sensor with Two-Step Dual-Mode Capacitance Scan",2014 IEEE International Solid-State Circuits Conference,Feb. 11, 2014,pp. 216-217.

Jose L. Bohorquez et al.,"A Biomedical Sensor Interface With a sinc Filter and Interference Cancellation", IEEE Journal of Solid-State Circuits, vol. 46, No. 4, Apr. 2011,pp. 746-756.

Keliu Shu et al.,"A 2.4-GHz Monolithic Fractional-N Frequency Synthesizer With Robust Phase-Switching Prescaler and Loop Capacitance Multiplier", IEEE Journal of Solid-State Circuits, vol. 38, No. 6, Jun. 2003,pp. 866-874.

Seyed Kasra Garakoui et al.,"Compact Cascadable gm-C All-Pass True Time Delay Cell With Reduced Delay Variation Over Frequency",IEEE Journal of Solid-State Circuits, vol. 50, No. 3, Mar. 2015,pp. 693-703.

Ki-Duk Kim et al.,"A Capacitive Touch Controller Robust to Display Noise for Ultrathin Touch Screen Displays",2012 IEEE International Solid-State Circuits Conference,Feb. 20, 2012,pp. 116-117.

Noriyuki Miura et al.,"A 1 mm Pitch 80 × 80 Channel 322 Hz Frame-Rate Multitouch Distribution Sensor With Two-Step Dual-Mode Capacitance Scan",IEEE Journal of Solid-State Circuits, vol. 50, No. 11, Nov. 2015,pp. 2741-2749.

* cited by examiner

HIGH SENSITIVITY READOUT CIRCUIT FOR TOUCH PANEL

CROSS-REFERENCE TO RELATED APPLICATION

This application claims the priority benefit of U.S. provisional application Ser. No. 62/577,175, filed on Oct. 26, 2017. The entirety of the above-mentioned patent application is hereby incorporated by reference herein and made a part of this specification.

BACKGROUND

Technical Field

The invention generally relates to a readout circuit and a driving method. More particularly, the invention relates to a high sensitivity readout circuit for a touch panel and a method for driving the touch panel.

Description of Related Art

In a self-capacitance sensing method of a touch panel, a driving signal generates an induced electric field on self-capacitors. When an external conductor changes the induced electric field, it is equivalently deemed as a capacitance variation of the self-capacitor. An analog front-end circuit is used to amplify the sensing signal that is converted from the capacitance variation. It is detected whether the external conductor touches the touch panel.

However, due to self-capacitors and wire resistors, the touch panel has a frequency response with a narrow band, and it limits the driving frequency of the driving signal. In some applications, interference signals generated by a charger may influence the sensing signal of the touch panel. Some frequency bands of the interference signals may locate in the frequency band that is available for the sensing signal, and thus serious interference may happens. The sensing signal and the charger noise are mixed and difficult to be separated.

Therefore, how to design a high sensitivity readout method for read out sensing signals with a large signal-to-noise ratio is an important issue for those technicians of the field.

SUMMARY

The invention is directed to a high sensitivity readout circuit for a touch panel and a method for driving the touch panel.

The invention provides a readout circuit of a touch panel. The readout circuit includes a charge modulator and a correlated double sampling demodulator. The charge modulator is configured to provide a driving current to charge or discharge a sensing electrode of the touch panel and generate a sensing voltage signal. The correlated double sampling demodulator is coupled to the charge modulator. The correlated double sampling demodulator is configured to sample the sensing voltage signal to obtain a voltage variation when a touch event happens.

In an embodiment of the invention, the correlated double sampling demodulator samples the sensing voltage signal to obtain a base voltage when the touch event does not happen. The voltage variation is obtained according to the base voltage.

In an embodiment of the invention, the correlated double sampling demodulator samples the sensing voltage signal during different time periods to respectively generate a first voltage signal and a second voltage signal when the touch event happens. The voltage variation is obtained further according to a voltage difference of the first voltage signal and the second voltage signal.

In an embodiment of the invention, the charge modulator modulates the driving current with a predetermined frequency to convert the sensing voltage signal of a direct-current format into the sensing voltage signal of an alternating-current format.

In an embodiment of the invention, the correlated double sampling demodulator demodulates the sensing voltage signal with the same predetermined frequency, and the first voltage signal and the second voltage signal of the direct-current format are generated.

In an embodiment of the invention, the charge modulator includes at least one current source to provide the driving current.

In an embodiment of the invention, the charge modulator charges or discharges the sensing electrode based on at least one control clock.

In an embodiment of the invention, the charge modulator resets a voltage of the sensing electrode to a common voltage according to a reset signal before charging or discharging the sensing electrode.

In an embodiment of the invention, the correlated double sampling demodulator samples the sensing voltage signal during a time period between a charging period and a discharging period.

In an embodiment of the invention, the readout circuit further includes a low-pass filter circuit. The low-pass filter circuit is coupled to the correlated double sampling demodulator. The low-pass filter circuit is configured to filter a noise signal from the sensing voltage signal.

The invention provides a method for driving a touch panel. The method includes: providing a driving current to charge or discharge a sensing electrode of the touch panel and generate a sensing voltage signal; and sampling the sensing voltage signal to obtain a voltage variation when a touch event happens.

In an embodiment of the invention, the method further includes: sampling the sensing voltage signal to obtain a base voltage when the touch event does not happen. The voltage variation is obtained according to the base voltage.

In an embodiment of the invention, the step of sampling the sensing voltage signal to obtain the voltage variation when the touch event happens includes: sampling the sensing voltage signal during different time periods to respectively generate a first voltage signal and a second voltage signal when the touch event happens. The voltage variation is obtained further according to a voltage difference of the first voltage signal and the second voltage signal.

In an embodiment of the invention, in the step of providing the driving current to charge or discharge the sensing electrode of the touch panel and generate the sensing voltage signal, the driving current is modulated with a predetermined frequency to convert the sensing voltage signal of a direct-current format into the sensing voltage signal of an alternating-current format.

In an embodiment of the invention, in the step of sampling the sensing voltage signal during the different time periods to respectively generate the first voltage signal and the second voltage signal when the touch event happens, the sensing voltage signal is demodulated with the same predetermined frequency, and the first voltage signal and the second voltage signal of the direct-current format are generated.

In an embodiment of the invention, the method further includes: resetting a voltage of the sensing electrode to a common voltage according to a reset signal before charging or discharging the sensing electrode.

In an embodiment of the invention, the sensing voltage signal is sampled during a time period between a charging period and a discharging period.

In an embodiment of the invention, the method further includes: filtering a noise signal from the sensing voltage signal.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

It is to be understood that other embodiments may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
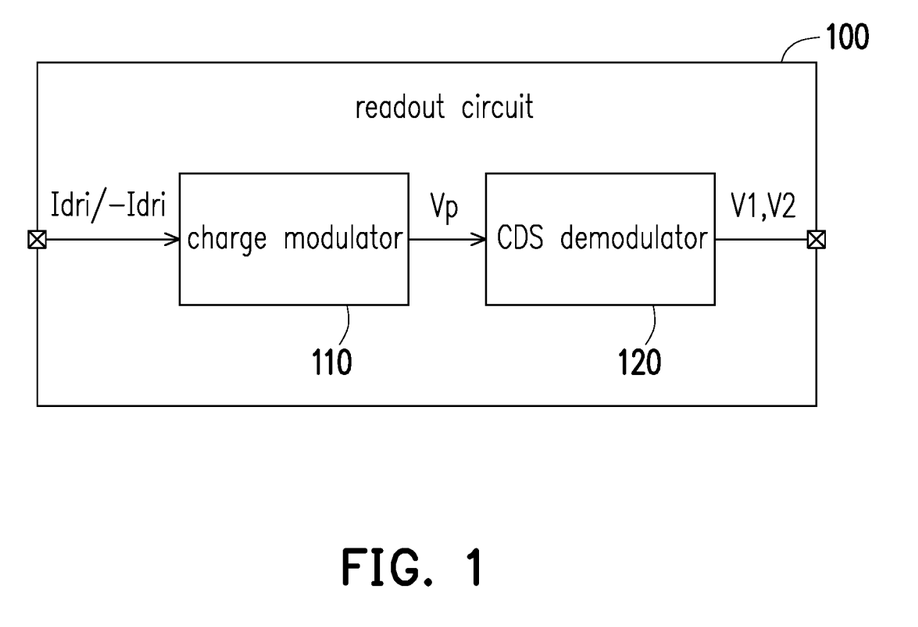
FIG. 1 illustrates a readout circuit for touch panel sensors according to an embodiment of the invention.

FIG. 1 illustrates a readout circuit for touch panel sensors according to an embodiment of the invention. Referring to FIG. 1, the readout circuit 100 of the present embodiment includes a charge modulator 110 and a correlated double sampling (CDS) demodulator 120. The charge modulator 110 is coupled to at least one touch panel sensor, for example a sensing electrode of a touch panel. The charge modulator 110 provides a driving current Idri or −Idri to charge or discharge the sensing electrode. The charge modulator 110 may include at least one current source to provide the driving current Idri or −Idri in an embodiment. The driving current Idri represents that the charge modulator 110 outputs the current and charges the sensing electrode. The driving current −Idri represents that the current flows into the charge modulator 110 and discharges the sensing electrode. As a result, a sensing voltage signal Vp is generated at a node of the charge modulator 110 when a touch event happens.

In the present embodiment, the CDS demodulator 120 is coupled to the charge modulator 110. The CDS demodulator 120 samples the sensing voltage signal Vp during different time periods to respectively generate a first voltage signal V1 and a second voltage signal V2. A voltage variation indicating that the touch event happens may be obtained according to the voltage difference of the first voltage signal V1 and the second voltage signal V2 when the touch event happens. The first voltage signal V1 and the second voltage signal V2 are transmitted to a circuit block of next stage. In an embodiment, the circuit block of next stage may include a filter circuit.

Figure 2:
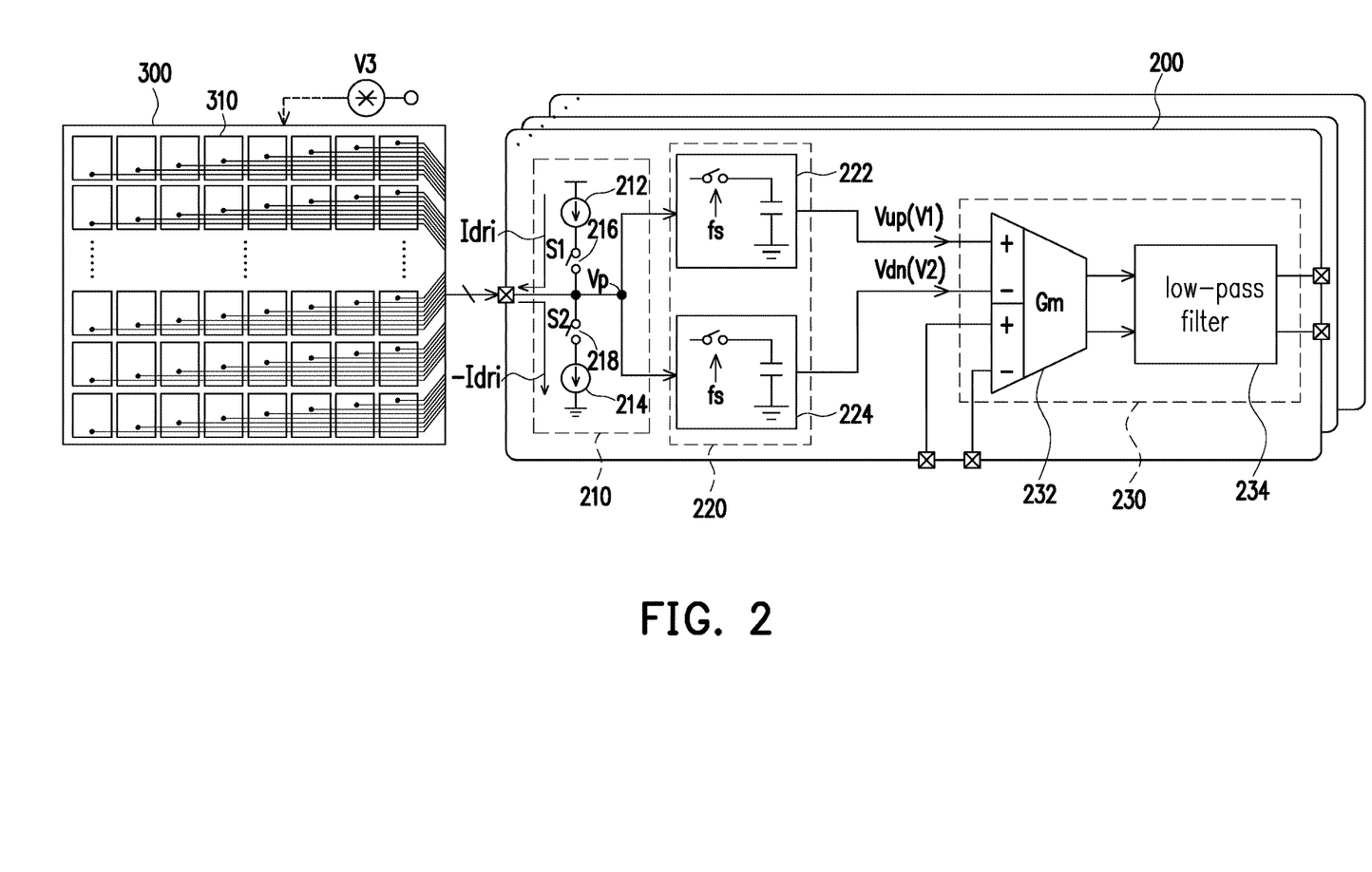
FIG. 2 illustrates a readout circuit and a touch panel according to an embodiment of the invention.
Figure 3:
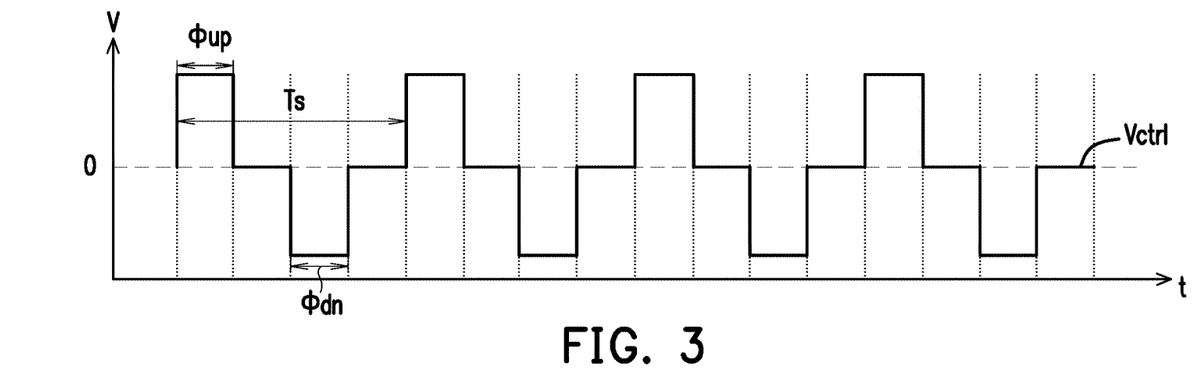
FIG. 3 illustrates a waveform diagram of a control clock depicted in FIG. 2.
Figure 4:
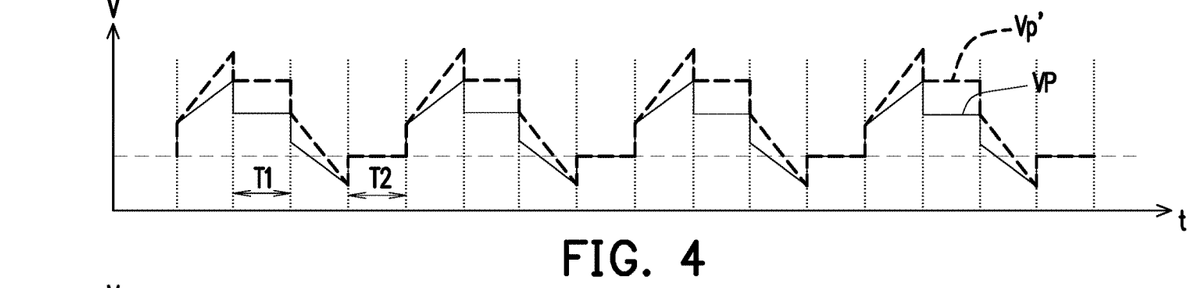
FIG. 4 illustrates a waveform diagram of a sensing voltage signal depicted in FIG. 2.
Figure 5:
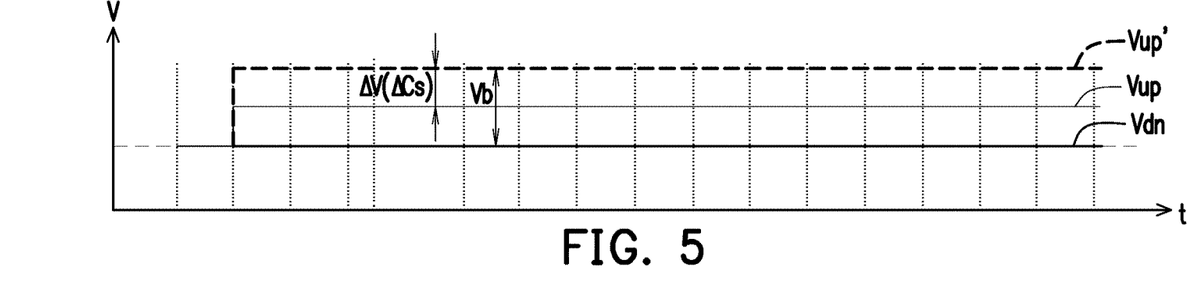
FIG. 5 illustrates a waveform diagram of a first voltage signal and a second voltage signal depicted in FIG. 2.

FIG. 2 illustrates a readout circuit and a touch panel according to an embodiment of the invention. FIG. 3 illustrates a waveform diagram of a control clock depicted in FIG. 2. FIG. 4 illustrates a waveform diagram of a sensing voltage signal depicted in FIG. 2. FIG. 5 illustrates a waveform diagram of a first voltage signal and a second voltage signal depicted in FIG. 2. Referring to FIG. 2 to FIG. 5, a readout circuit 200 is coupled to a touch panel 300 to read out sensing signals from touch panel sensors 310 of the touch panel 300. In the present embodiment, an electronic device including the touch panel 300 may be charged by a charger (not shown), and charger noises V3 may be coupled to the sensing electrodes. The charger noises V3 may influence detection result of the touch panel sensors.

In the present embodiment, the readout circuit 200 includes a charge modulator 210, a CDS demodulator 220 and a filter circuit 230. The charge modulator 210 includes a charge pump. Two current sources 212 and 214 respectively provide driving currents Idri and −Idri to serve as driving signals. The touch panel 300 is driven in a manner of current driving. Two switch elements 216 and 218 are controlled by a control clock Vctrl as shown in FIG. 3. The control clock Vctrl includes control pulses S1 and S2 to respectively control conduction states of the switch elements 216 and 218. When the control pulse S1 turns on the switch element 216 during a charging period Φup, the control pulse S2 turns off the switch element 218. The driving current Idri flows into the touch panel 300 and charges the touch panel sensor 310. When the control pulse S2 turns on the switch element 218 during a discharging period Φdn, the control pulse S1 turns off the switch element 216. The driving current −Idri flows into the readout circuit 200 and discharges the touch panel sensor 310. The driving frequency fs is 1/Ts, where Ts is a driving period. Accordingly, waveforms of sensing voltage signals Vp and Vp' are shown in FIG. 4. The sensing voltage signals Vp and Vp' are the voltage at the node of the charge modulator 210 connected to the CDS demodulator 220. The solid line shows the waveform of the sensing voltage signal Vp when the touch event happens. The dashed line shows the waveform of the sensing voltage signal Vp' when the touch event does not happen.

In the present embodiment, the CDS demodulator 220 samples the sensing voltage signal Vp during different time periods. The CDS demodulator 220 includes sample and hold circuits 222 and 224. The sample and hold circuit 222 samples the sensing voltage signal Vp during a time period T1 to generate the first voltage signal Vup when the touch event happens. On the other hand, the sample and hold circuit 222 samples the sensing voltage signal Vp' during the time period T1 to generate the first voltage signal Vup' when the touch event does not happen. The sample and hold circuit 222 samples the sensing voltage signal Vp or Vp' during a time period T2 to generate the second voltage signal Vdn. That is to say, the CDS demodulator 220 samples the sensing voltage signal Vp or Vp' during the time periods between the charging period Φup and the discharging period Φdn. The waveforms of the first voltage signals Vup and Vup' and the second voltage signal Vdn are shown in FIG. 5.

In the present embodiment, when the touch event does not happen, the voltage difference of the first voltage signal Vup' and the second voltage signal Vdn is a based voltage Vb, i.e. Vup'−Vdn=Vb. When the touch event happens, the voltage difference of the first voltage signal Vup and the second voltage signal Vdn is obtained, i.e. Vup−Vdn=Vb−ΔV. The voltage difference of the first voltage signals Vup and Vup' is the voltage variation ΔV, which indicates that the touch event happens. Therefore, the voltage variation ΔV is obtained according to the based voltage Vb and the voltage difference of the first voltage signal Vup and the second voltage signal Vdn, i.e. ΔV=Vb−(Vup−Vdn). The voltage variation ΔV corresponds to a capacitance variation ΔCs of the touch panel sensor. Accordingly, the sensing voltage signal includes a capacitance variation information when the touch event happens.

In the present embodiment, the filter circuit 230 includes an operational transconductance amplifier 232 and a low-pass filter 234. The operational transconductance amplifier 232 may has a large input swing and a low transconductance value. The operational transconductance amplifier 232 receives the first voltage signal Vup or Vup' and the second voltage signal Vdn and produces an output current to the low-pass filter 234. The low-pass filter 234 may be a charge sampling low-pass filter such as a high order DT IIR low-pass filter. The low-pass filter 234 filters the charger noises V3 which have been modulated to high frequency from the sensing voltage signal, such that the signal-to-noise ratio of the sensing voltage signal is increased. Next, the sensing voltage signal is amplified to have a preset output swing and outputted to a circuit block of next-stage.

Figure 6:
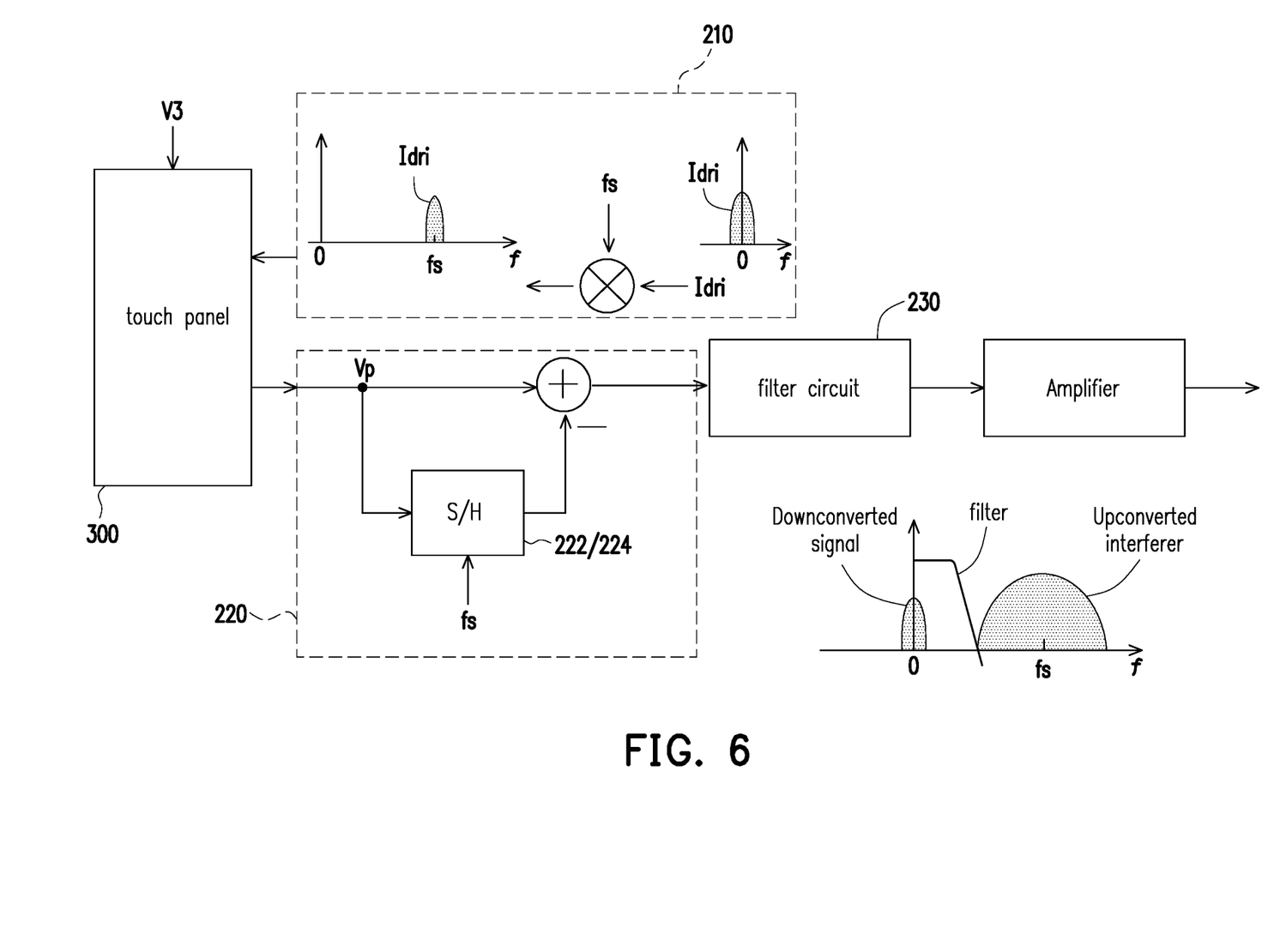
FIG. 6 illustrates a signal processing flowchart of the readout circuit and the touch panel in frequency domain according to an embodiment of the invention.

FIG. 6 illustrates a signal processing flowchart of the readout circuit and the touch panel in frequency domain according to an embodiment of the invention. Referring to FIG. 6, the driving current Idri drives the touch panel 300 to sense the touch event. The charge modulator 210 modulates the driving current Idri with a predetermined frequency such as the driving frequency fs. The charge modulator 210 converts the driving current Idri of a direct-current (DC) format into the driving current Idri of an alternating-current (AC) format. The driving current Idri is converted from a DC signal to an AC signal which has the predetermined frequency fs. When the touch panel 300 is charged by a charger (not shown), the charger noise V3 may be carried on the driving current Idri and/or the sensing signal.

The CDS demodulator 220 demodulates the sensing voltage signal Vp with the same predetermined frequency fs, and the first voltage signal Vup and the second voltage signal Vdn of the DC format are generated. The downconverted signal schematically shows the first voltage signal Vup and the second voltage signal Vdn with a zero frequency, i.e. a DC signal. The upconverted interferer indicating the charger noise V3 still locates around the driving frequency fs. The filter circuit 230 filters the upconverted interferer to obtain the downconverted signal so as to increase the signal-to-noise ratio of the sensing voltage signal. The downconverted signal includes a parasitic constant capacitance corresponding to the capacitance variation LCs when the touch event happens. A reverse DC compensation signal is used to remove the parasitic constant capacitance. The DC signal of the capacitance variation ΔCs is obtained and amplified.

Figure 7:
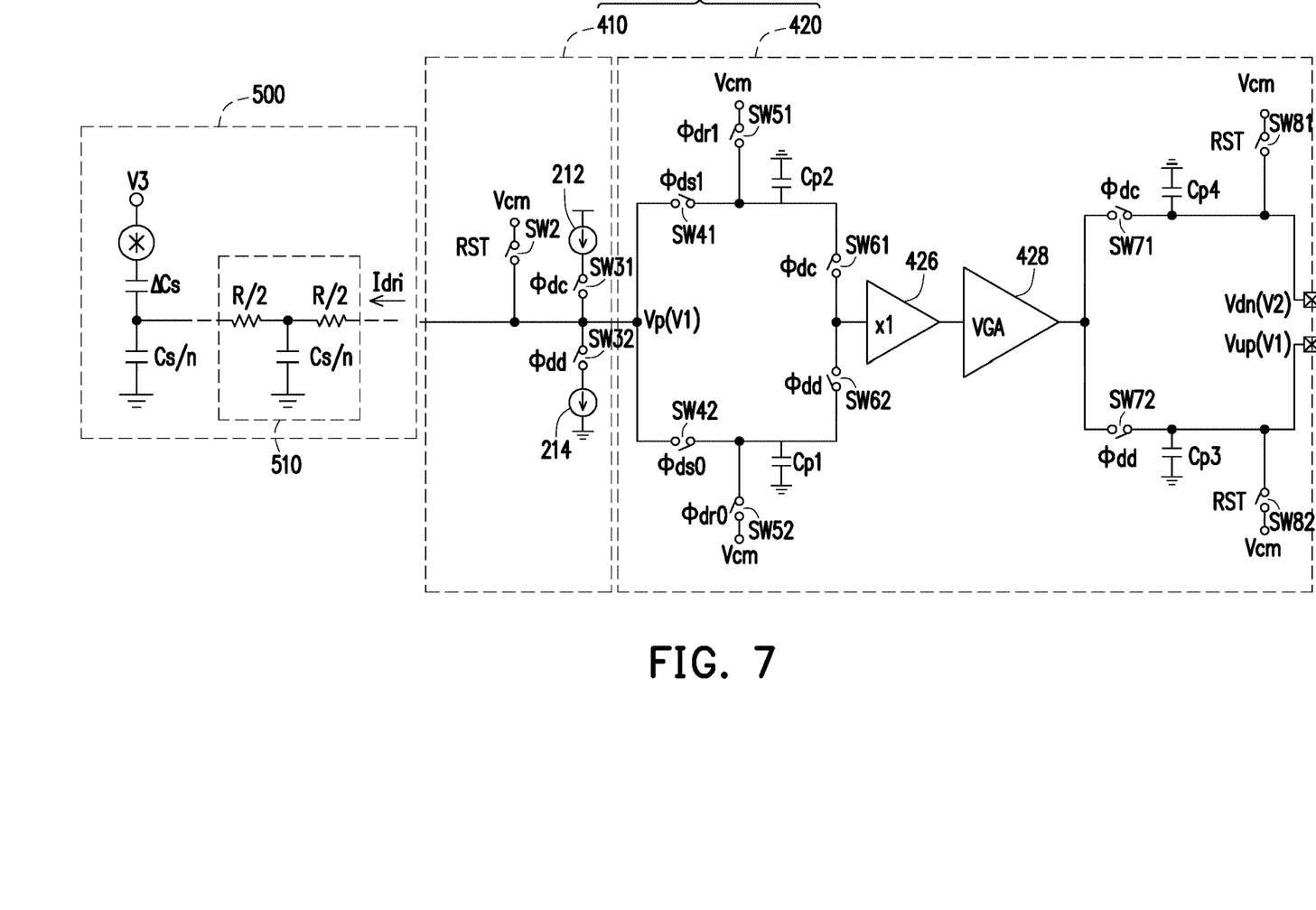
FIG. 7 illustrates a readout circuit and a touch panel according to an embodiment of the invention.
Figure 8:
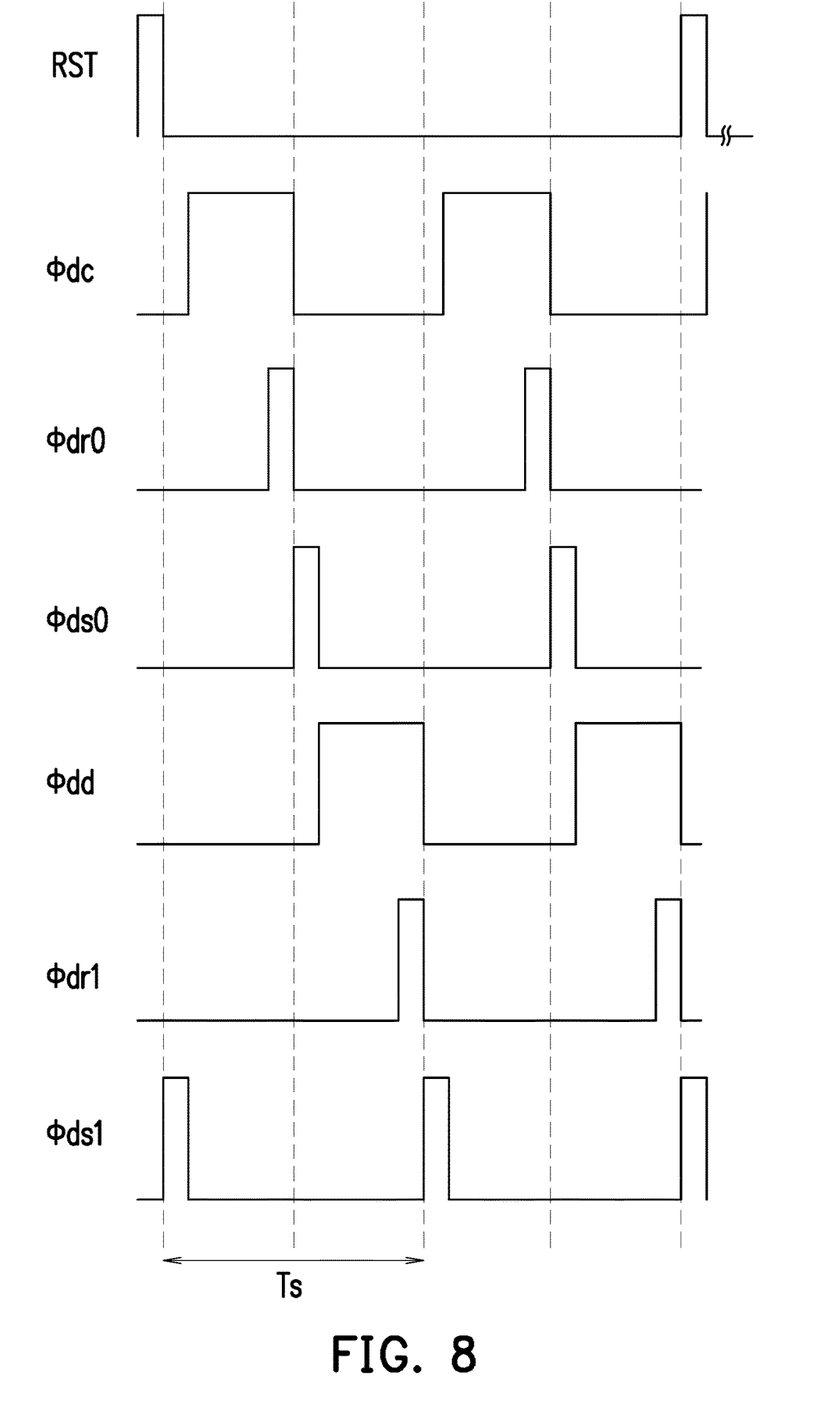
FIG. 8 illustrates waveform diagrams of control clocks depicted in FIG. 7.

FIG. 7 illustrates a readout circuit and a touch panel according to an embodiment of the invention. FIG. 8 illustrates waveform diagrams of control clocks depicted in FIG. 7. Referring to FIG. 7 and FIG. 8, equivalent circuits of a touch panel 500 and a sensing electrode 510 are depicted in FIG. 7. The readout circuit 400 includes a charge modulator 410 and a CDS demodulator 420. In the present embodiment, the readout circuit 400 operates in a manner of time division multiple process. That is to say, one readout circuit processes sensing signals from different sensing electrodes during different time divisions.

As illustrated in FIG. 8, the signals Φdc and Φdd are control clocks for charging and discharging, and the signal RST is a reset signal to reset the sensing electrode 510 to a common voltage Vcm. When the readout circuit 400 connects to one sensing electrode 510, the switch element SW2 is turned on by the reset signal RST such that the sensing electrode 510 is initially reset to the common voltage Vcm. When the sensing electrode 510 is charged or discharged, the switch element SW2 is turned off by the reset signal RST. When the readout circuit 400 connects to another sensing electrode 510, the switch element SW2 is turned on by the reset signal RST again.

During the charging period, the control clock Φdc turns on the switch element SW31, and the driving current Idri charges the sensing electrode 510. Before the capacitor Cp1 samples the sensing voltage signal Vp or Vp', the control clock Φdr0 turns on the switch element SW52, and the capacitor Cp1 is reset to the common voltage Vcm. Next, the control clock Φds0 turns on the switch element SW42, and the capacitor Cp1 samples the sensing voltage signal Vp or Vp'. During the discharging period, the control clock Φdd turns on the switch elements SW62 and SW72, and the sensing voltage signal Vp or Vp' stored in the capacitor Cp1 is transmitted to the capacitor Cp3 via the buffer 426 and the variable-gain amplifier 428. The capacitor Cp3 stores the sampled sensing voltage signal Vp or Vp' to serve as the first voltage signal Vup or Vup' (V1). On the other hand, before the sample and hold operations, the switch element SW82 is turned on by the reset signal RST to reset the capacitor Cp3 to the common voltage Vcm.

Similarly, during the discharging period, the control clock Φdd turns on the switch element SW32, and the driving current −Idri discharges the sensing electrode 510. Before the capacitor Cp2 samples the sensing voltage signal Vp or Vp', the control clock Φdr1 turns on the switch element SW51, and the capacitor Cp2 is reset to the common voltage Vcm. Next, the control clock Φds1 turns on the switch element SW41, and the capacitor Cp2 samples the sensing voltage signal Vp or Vp'. During the charging period, the control clock Φdc turns on the switch elements SW61 and SW71, and the sensing voltage signal Vp or Vp' stored in the capacitor Cp2 is transmitted to the capacitor Cp4 via the buffer 426 and the variable-gain amplifier 428. The capacitor Cp4 stores the sampled sensing voltage signal Vp or Vp' to serve as the second voltage signal Vdn (V2). On the other hand, before the sample and hold operations, the switch element SW81 is turned on by the reset signal RST to reset the capacitor Cp4 to the common voltage Vcm. Next, the first voltage signal Vup (V1) and the second voltage signal Vdn (V2) are outputted to the circuit block of next-stage such as an operational transconductance amplifier depicted in FIG. 2 or other similar circuit elements.

Figure 9:
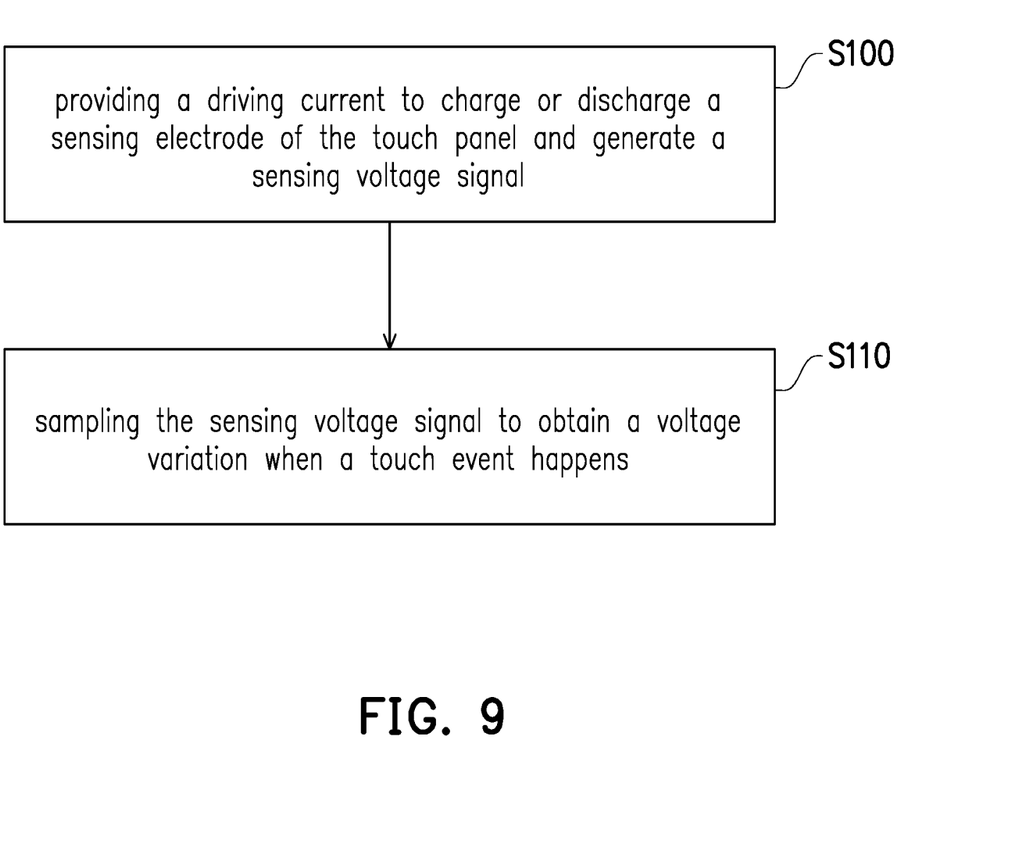
FIG. 9 illustrates a flowchart of a method for driving a touch panel according to an embodiment of the invention.

FIG. 9 illustrates a flowchart of a method for driving a touch panel according to an embodiment of the invention. Referring to FIG. 1 and FIG. 9, the method for driving the touch panel of the embodiment is at least adapted to the readout circuit 100 of FIG. 1, but the invention is not limited thereto. Taking the readout circuit 100 of FIG. 1 for example, in step S100, the charge modulator 110 provides the driving current Idri or −Idri to charge or discharge the sensing electrode of the touch panel 300 and generates the sensing voltage signal Vp. In step S110, the CDS demodulator 120 samples the sensing voltage signal Vp to obtain a voltage variation ΔV when the touch event happens. The voltage variation ΔV indicates that the touch event happens. In addition, sufficient teaching, suggestion, and implementation illustration regarding the data transmission method of the embodiments of the disclosure may be obtained from the foregoing embodiments of FIG. 1 to FIG. 8.

In summary, in the exemplary embodiments of the invention, the readout circuit drives the touch panel in a manner of current driving. The charging and/or discharging operations are performed by a charge pump. The readout circuit modulates the sensing signal with a predetermined frequency, such that the sensing signal becomes an AC signal having a charger noise. The readout circuit further demodulates the sensing signal with the same frequency, and the sensing signal becomes a DC signal and the charger noise is still the AC signal. The charger noise is removed by a low-pass filter. The sensing signal has a larger signal-to-noise ratio, and the readout circuit has high sensitivity.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A readout circuit of a touch panel, the readout circuit comprising:
    a charge modulator configured to provide a driving current to charge or discharge a sensing electrode of the touch panel and generate a sensing voltage signal; and
    a correlated double sampling demodulator coupled to the charge modulator and configured to sample the sensing voltage signal to obtain a voltage variation when a touch event happens, wherein the charge modulator modulates the driving current with a predetermined frequency, and the correlated double sampling demodulator demodulates the sensing voltage signal with the same predetermined frequency.

2. The readout circuit as claimed in claim 1, wherein the charge modulator comprises at least one current source to provide the driving current.

3. The readout circuit as claimed in claim 1, wherein the charge modulator charges or discharges the sensing electrode based on at least one control clock.

4. The readout circuit as claimed in claim 1, wherein the charge modulator resets a voltage of the sensing electrode to a common voltage according to a reset signal before charging or discharging the sensing electrode.

5. The readout circuit as claimed in claim 1, wherein the correlated double sampling demodulator samples the sensing voltage signal during a time period between a charging period and a discharging period.

6. The readout circuit as claimed in claim 1, further comprising:
    a low-pass filter circuit coupled to the correlated double sampling demodulator and configured to filter a noise signal from the sensing voltage signal.

7. The readout circuit as claimed in claim 1, wherein the correlated double sampling demodulator samples the sensing voltage signal to obtain a base voltage when the touch event does not happen, and the voltage variation is obtained according to the base voltage.

8. The readout circuit as claimed in claim 7, wherein the correlated double sampling demodulator samples the sensing voltage signal during different time periods to respectively generate a first voltage signal and a second voltage signal when the touch event happens,
    wherein the voltage variation is obtained further according to a voltage difference of the first voltage signal and the second voltage signal.

9. The readout circuit as claimed in claim 8, wherein the charge modulator converts the sensing voltage signal of a direct-current format into the sensing voltage signal of an alternating-current format.

10. The readout circuit as claimed in claim 9, wherein the first voltage signal and the second voltage signal of the direct-current format are generated.

11. A method for driving a touch panel, the method comprising:
    providing a driving current to charge or discharge a sensing electrode of the touch panel and generate a sensing voltage signal, wherein the driving current is modulated with a predetermined frequency; and
    sampling the sensing voltage signal to obtain a voltage variation when a touch event happens, wherein the sensing voltage signal is demodulated with the same predetermined frequency.

12. The method as claimed in claim 11, further comprising:
    sampling the sensing voltage signal to obtain a base voltage when the touch event does not happen, wherein the voltage variation is obtained according to the base voltage.

13. The method as claimed in claim 11, wherein the step of sampling the sensing voltage signal to obtain the voltage variation when the touch event happens comprises:
    sampling the sensing voltage signal during different time periods to respectively generate a first voltage signal and a second voltage signal when the touch event happens,
    wherein the voltage variation is obtained further according to a voltage difference of the first voltage signal and the second voltage signal.

14. The method as claimed in claim 11, further comprising resetting a voltage of the sensing electrode to a common voltage according to a reset signal before charging or discharging the sensing electrode.

15. The method as claimed in claim 11, wherein the sensing voltage signal is sampled during a time period between a charging period and a discharging period.

16. The method as claimed in claim 11, further comprising:
    filtering a noise signal from the sensing voltage signal.

17. The method as claimed in claim 11, wherein in the step of providing the driving current to charge or discharge the sensing electrode of the touch panel and generate the sensing voltage signal, the sensing voltage signal of a direct-current format is converted into the sensing voltage signal of an alternating-current format.

18. The method as claimed in claim 17, wherein in the step of sampling the sensing voltage signal during the different time periods to respectively generate the first voltage signal and the second voltage signal when the touch event happens, the first voltage signal and the second voltage signal of the direct-current format are generated.

* * * * *